United States Patent [19]

Bahraman

[11] Patent Number: 5,171,994
[45] Date of Patent: Dec. 15, 1992

[54] INFRARED STARING IMAGING ARRAY

[75] Inventor: Ali Bahraman, Palos Verdes Estates, Calif.

[73] Assignee: Northrop Corporation, Los Angeles, Calif.

[21] Appl. No.: 226,498

[22] Filed: Aug. 1, 1988

Related U.S. Application Data

[63] Continuation-in-part of Ser. No. 896,358, Aug. 13, 1986, abandoned.

[51] Int. Cl.$^5$ .................... H01L 25/00; H01L 27/14; H01J 40/14; H04N 3/14
[52] U.S. Cl. ................................. 250/332; 358/212; 358/213.11; 358/213.12; 257/214; 257/441; 257/437
[58] Field of Search ................. 357/24, 30; 250/211 J, 250/332; 358/212, 213.11, 213.12

[56] References Cited

PUBLICATIONS

Baker et al, SPIE Staring IR Focal Plane Technology, vol. 267, pp. 80-85.
Dyck et al, SPIE Solid State Imaging Devices, vol. 116, 1977, pp. 19-23.
D. N. Pocock et al, Proc. DPIE Int. Soc. Opt. Eng., vol. 267, pp. 31-38, 1981.
D. N. Pocock et al, Proc. Soc. Photo-Optical Instr. Eng., vol. 217, pp. 120-138, 1980.
M. Gibbons et al, Proc. SPIE Int. Soc. Opt. Eng., vol. 443, p. 151, 1984.
A. Bahraman et al, IEDM Digest, p. 726, Dec. 1983.

Primary Examiner—Stephen C. Buczinski
Attorney, Agent, or Firm—Terry J. Anderson; Robert B. Block

[57] ABSTRACT

Monolithic InSb array devices are described for staring infrared imaging systems operating in the 3-5 μm spectral region. These devices are fabricated with only 4 mask levels compared to 5 mask levels for prior devices and have higher output dynamic ranges and greater wafer yield compared to previous designs. The devices are fabricated to include a substrate (15) having a field oxide (16) pattern thereon. A first gate oxide (17) is deposited over the field oxide with columns (21) patterned on the first gate oxide. A second gate oxide (19) is next deposited with rows (22) patterned on the second gate oxide. The devices can further include a passivation layer (29) deposited on the rows (22).

18 Claims, 10 Drawing Sheets

MEASURED ARRAY OUTPUT SIGNAL VS COLUMN VOLTAGE

MEASURED InSb FPA DETECTOR PHOTORESPONSE IN VOLTS/PHOTON. NORMALIZED TO PEAK VALUE.

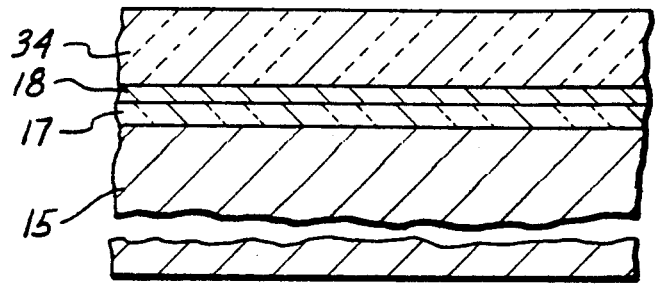
FIG 14A
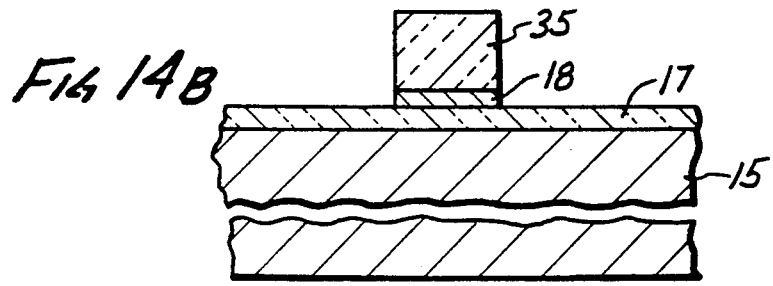
FIG 14B
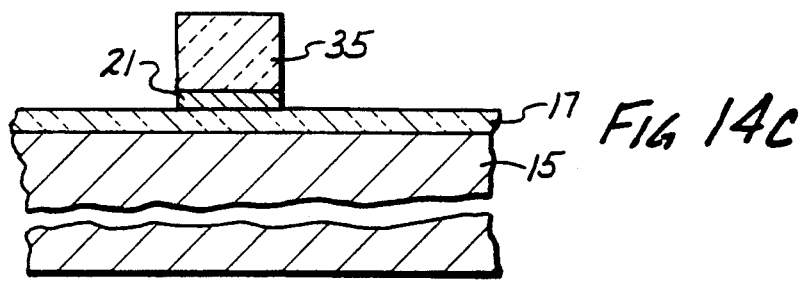
FIG 14C
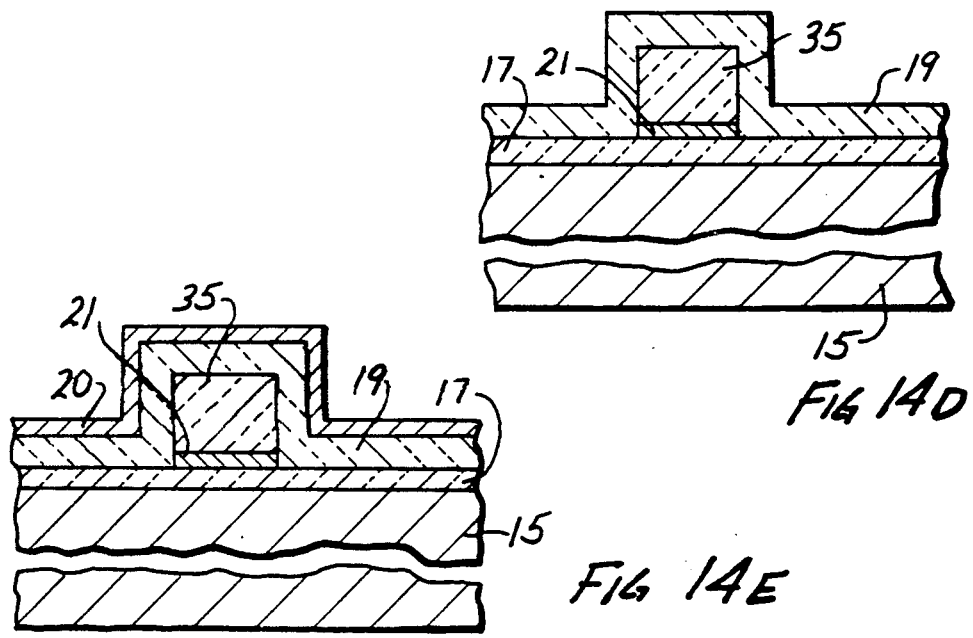
FIG 14D
FIG 14E

INFRARED STARING IMAGING ARRAY

This application is a continuation-in-part of Ser. No. 06/896,358, now abandoned.

TECHNICAL FIELD

This application is directed to infrared imaging devices, more particularly infrared staring imaging arrays and to their method of manufacture.

BACKGROUND ART

Infrared imaging systems operating in the 3–5 μm and 8–12 μm spectral regions are required for many electro-optical systems in order to provide coverage for day/-night and/or bad weather operation. In recent years, considerable effort has been devoted to the development of InSb and HgCdTe infrared imaging devices. For the 3–5 μm spectral region, an InSb charge injection device (CID) offers significant potential for the realization of cost-effective infrared staring imaging systems because of the relative simplicity in structure, fabrication and operation of CID arrays. Such systems have been described previously by M. Gibbons and S. Wang, "*Status of CID InSb Detector Technology*", Proc. SPIE Int. Soc. Opt. Eng., Vol. 443, 151 (1984) and, Ali Bahraman and David N. Pocock, "*Monolithic* 128×128 *InSb FPAs for Staring Infrared Systems*," IEDM Digest, 726 (December 1983). These prior art disclosures have presented performance data and thermal imagery obtained from 128×128 staring focal plane arrays. In an exemplary prior art design of which the present invention is an improvement there were 6 layers of material and 5 masking steps, one of which was critical and selectively removed an aluminum layer from a Cr layer until the latter was 50 Angstroms to 70 Angstroms thick. This masking step patterned the removed portions so that the 50 Angstroms–70 Angstroms Cr metal layer remaining formed an optical window to each element of the device. The criticality of this step gave poor product yield, limiting the sensitivity of the device and increasing its internal capacitance.

DISCLOSURE OF INVENTION

According to this invention, there have been developed monolithic staring imaging devices based on novel 4-mask array designs. These devices have been realized in InSb material, but they can also be implemented in other infrared materials, such as HgCdTe. The critical masking step used in the prior art has been eliminated from the process. In addition, improvements in cell design have resulted in 4× or greater increase in detector array dynamic range. The reduction of mask levels to only 4 and the increase in dynamic range make possible the realization of large, high-yield and high-performance, monolithic infrared staring imaging arrays. The arrays and methods of the present invention have been demonstrated as 128×128 arrays using 30×30 μm² unit cell size and 6.1×6.1 mm² chip size, and can be readily scaled up.

According to this invention, there have been developed staring infrared detector arrays including a semiconductor substrate, a field oxide layer patterned on said substrate to define active areas thereon, a first gate oxide layer, a first metal layer patterned to define columns, a second gate oxide layer and a second metal layer patterned to define rows.

In a preferred form of the invention, a product is produced consisting essentially of such layers and such product can be easily treated with a passivation oxide and/or antireflection coating.

The present invention is predicated on the realization that the capacitive elements of each cell which previously required a thin, semitransparent chromium window covering the active area of the cell could be replaced by substituting specially shaped row and column electrodes to form the capacitive elements and also the periphery of a totally exposed cell window and that the resulting benefits include not only the elimination of the chromium window together with its critical masking and etching steps but also include an increase in sensitivity and reduction in overall capacitance. Thus the patterned second metal layer of the present invention comprises the uppermost metal layer of devices of the invention.

In a preferred form of the invention, an optical window is provided in each cell to permit photons to pass into an underlying semiconductor substrate. The present invention utilizes the row and column metal electrode layers to define the optical window to each element, unimpeded by chromium or other semi transparent metal coverings metal, and thereby eliminates the need for metal layer window defining and masking steps. The optical window so formed has its periphery substantially defined by portions of the column and row metal layers. This further allows the optical window to be fashioned to include specified percentages of the area of each cell.

In a further preferred embodiment, the devices of the invention include a spacer oxide located over the patterned first metal layer. This spacer oxide is patterned to the pattern of the first metal layer utilizing the same pattern mask as that to pattern the first metal layer. The second gate oxide is then overlaid on the spacer oxide resulting in an oxide layer between the row and column metallization which is thicker than the oxide layer of the second gate oxide. This increased thickness of the oxide layer between the row and column metallization decreases the overlap capacitance between the row and columns while allowing for concurrent reduction in thickness of the second gate oxide layer for increases in the detector array output signal.

In still a further preferred embodiment the thickness of the first and second metal layers can be reduced to reduce the thickness of the row and column metallization while at the same time the thickness of the bonding pads for the rows and columns can be increased. This is also achieved using a 4-mask process by laying down thinner thicknesses of metal for the first and second metallization layers and applying a passivation coating as the final layer on the device. The passivation coating is then etched to the row and column bonding pads and additional metal is deposited on the bonding pads for wire bonding. This can be accommodated in a 4-mask process by utilizing a lift off process in conjunction with the final mask for etching the passivation layer. Excess metallization on all areas of the device except the bonding pads is lifted off of the device concurrently with removal of the photoresist mask defining the openings for the row and column bonding pads.

In still a further preferred embodiment bonding pads are not patterned in the first metallization layer and selective portions of the second gate oxide layer are then removed to define contact holes for the column bonding pads. The column bonding pads are formed concurrently with formation of the second metal layer and connected to the columns by depositing metallization in the contact holes of the second gate oxide.

In its method aspect, the invention includes the preparation of a staring infrared imaging CID array by using only four mask levels. The inventive method is embodied in the steps of providing an infrared substrate, depositing a field oxide on the substrate, selectively removing portions of the field oxide to define active areas followed by depositing a first gate oxide. A first metal layer is then deposited and patterned to form columns and a second gate oxide layer is deposited. A second metal layer is then deposited and portions thereof are selectively removed to define rows. In a preferred form of the method aspect of the invention the selective removal of portions of the first metal layer and second metal layer respectively, includes removal of such portions to define substantially the periphery of an optical window. The resulting product is one which can easily have an anti-reflection coating applied.

In one embodiment of the method of the invention selective portions of the second gate oxide are removed to define contact holes for connecting with bonding pads for the columns of the device. Column bonding pads are concurrently formed in the second metal layer and are connected to the first metal layer via the defined contact holes.

In a further embodiment of the method of the invention a spacer oxide layer is overlaid on the first metal layer prior to the patterning of the first metal layer. Portions of this spacer oxide layer are then removed through a first metal pattern mask followed by removal of the selective portions of the first metal layer through the same pattern mask. As so formed the spacer oxide overlays the patterning of the first metal layer. The second gate oxide is then deposited over the patterned spacer oxide layer.

In even a further embodiment of the method of the invention a passivation oxide is deposited over the second metal layer after patterning of the same. Portions of this passivation oxide which overlay row and column bonding pads are then removed through a fourth and final mask. A further metal layer is then deposited through this same patterning mask onto the row and column bonding pads to increase the metallization thickness of the row and column bonding pads compared to the metallization thickness of the first and second metal layers. The patterned mask is then removed utilizing a lift off process which removes any metallization over any area of the device except the row and column bonding pads.

It was an object of this invention to reduce the number of mask levels needed for array fabrication.

It was a further object of this invention to increase wafer yield.

A still further object of this invention was to provide a design easily adaptable to providing an anti-reflection coating in order to improve quantum efficiency. Another object of this invention was to achieve better pixel-to-pixel uniformity.

A still further object of the invention was to eliminate field oxide between adjacent cells in the row direction in order to increase the fraction of the active area per cell.

A still further object was to reduce row-to-column overlap capacitance.

These and other objects of the invention have been accomplished by the new design and method for its fabrication. The new design, importantly, eliminates previously used optical windows consisting of a 50-70 Angstroms semi-transparent chromium (Cr) layer which did not allow a straightforward design and fabrication of an anti-reflection coating.

Moreover, the elimination of the chromium optical window has resulted in appreciable pixel-to-pixel uniformity, in elimination of one masking step, and in a significant increase in wafer yield.

The foregoing and other objects of the invention will be apparent from the following detailed description of the invention and the accompanying drawings.

BRIEF DESCRIPTION OF THE DRAWINGS

In the drawings:

FIGS. 1 and 1A show respectively a top plan view and details of a staring infrared detector array charge injection device according to the invention;

FIG. 14 is a schematic layout showing in the various stages in proceeding from FIG. 14A through and including FIG. 14E the formation of a spacer oxide layer between the first and second metal layers of a device of the invention.

MODES FOR CARRYING OUT THE INVENTION

Figure 2:
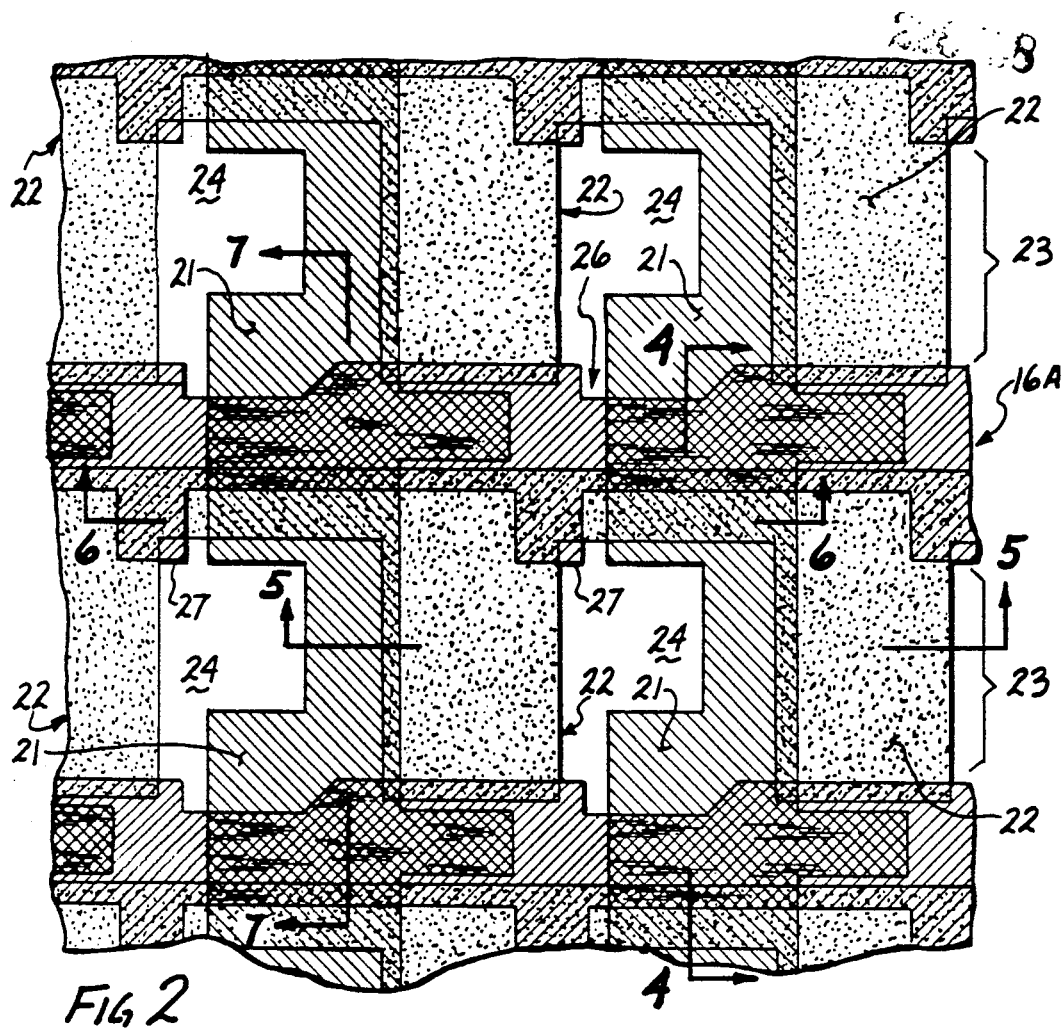
FIG. 2 shows a schematic layout of the field oxide (FIG. 2A) and metal layers (FIGS. 2B, 2C) according to the invention.

Referring now to the drawings, FIG. 1 shows an infrared staring array embodying the invention. The array includes 128 columns and 128 rows. Each column or row is provided with a bonding pad for interfacing to silicon chips on the focal plane substrate.

Referring to FIGS. 2–7, there is shown an array constructed according to the invention fabricated on an InSb substrate 15. The array includes a patterned field oxide layer 16 (FIG. 2A), a first gate oxide layer 17, a patterned first metal layer 18 (FIG. 2B) forming column electrodes, a second gate oxide layer 19, and a patterned second metal layer 20 (FIG. 2C) forming row electrodes.

The first metal layer 18 is patterned to define columns electrodes 21 and the second metal layer 20 is patterned to define rows electrodes 22. The field oxide layer 16 is patterned to define an active area 23 on substrate 15.

The patterning of columns 21, rows 22 also provide the periphery of an optical window 24 for each cell of the array.

Figure 2A:
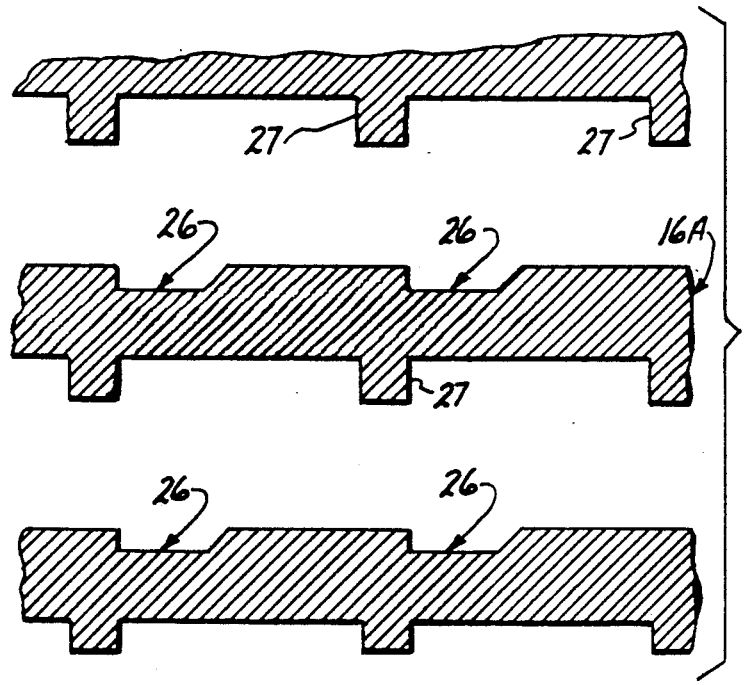
FIG. 2A, 2B AND 2C are the first, third and fifth layers respectively, each shown after patterning; the metal layer of FIG. 2C being shown in half-tone for clarity of illustration.
Figure 2:
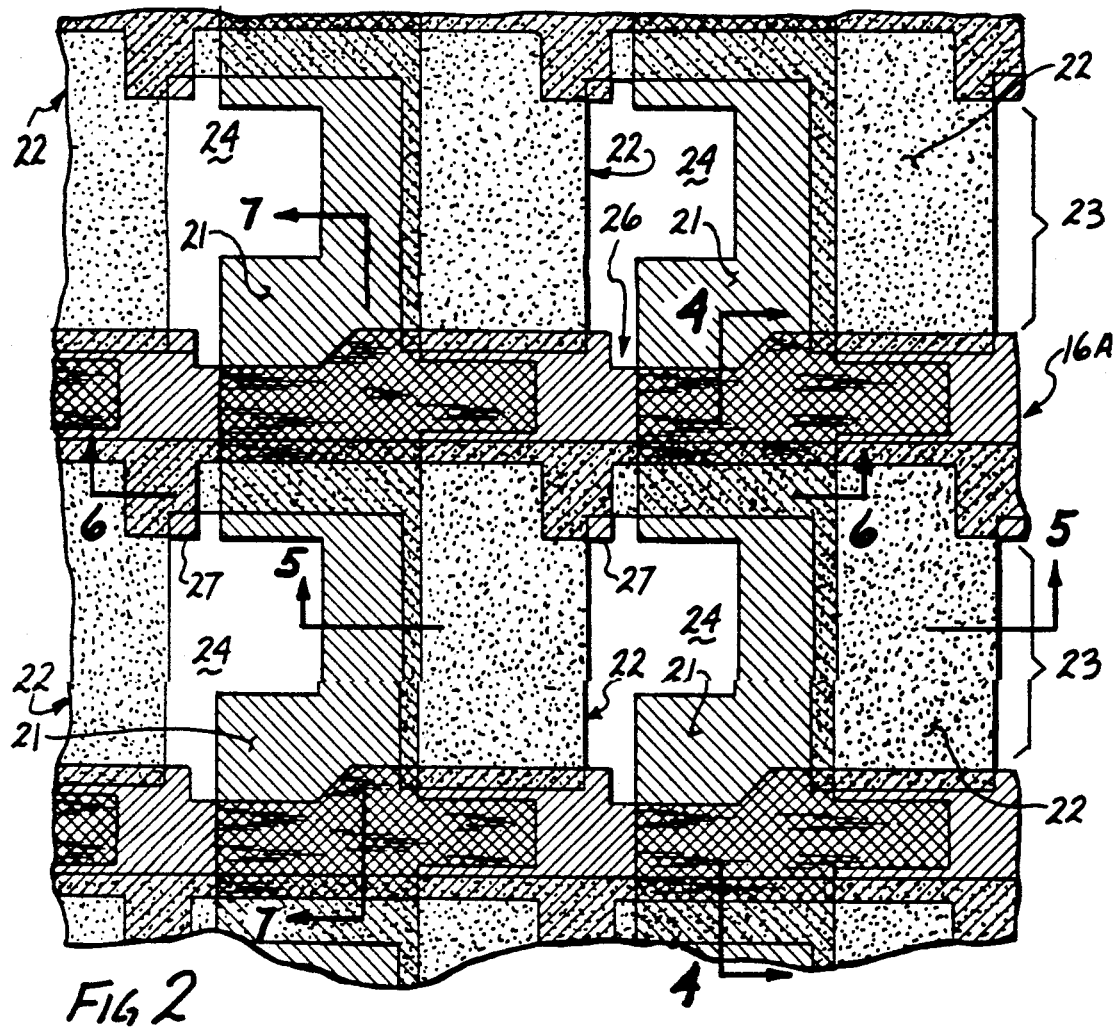
Figure 2A:
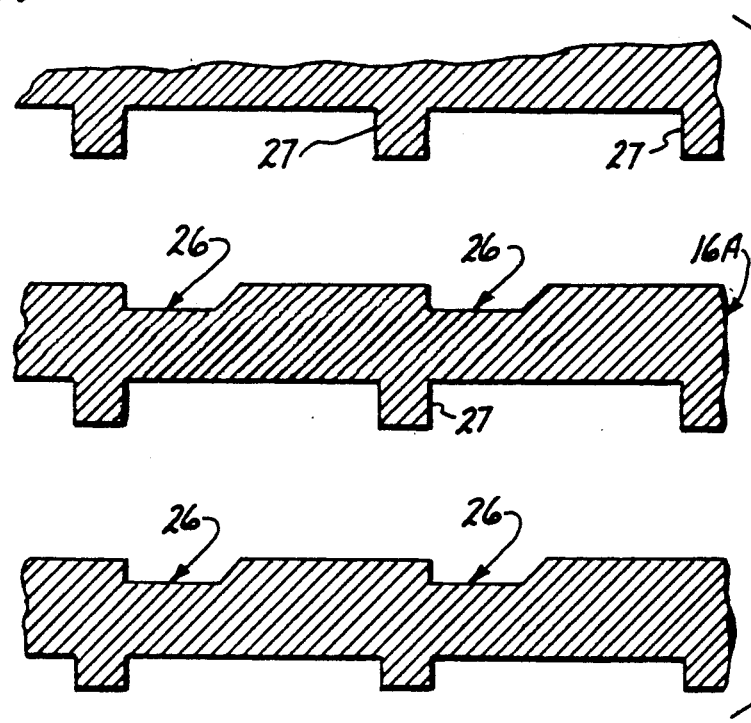

Referring now to FIG. 2, field oxide layer 16 of pure $SiO_2$ is patterned by masking and etching in such a manner that separate elongate strips 16a are formed in the direction of rows 22. The field oxide strips 16a have indentations 26 on one edge thereof to provide additional active areas. On the opposite edge, strips 16a have an outwardly extending charge separation protrusion 27 which separate the cells on two sides only and serve to separate adjacent cell charges during readout. The charge separation protrusions 27 confine the cell charge during read-out appropriately to row 22 positioned to the left of protrusion 27 in the drawings.

Optical window 24 is sized and positioned to permit photons to pass into underlying semiconductor substrate 15. As a practical matter, the optical window should be limited to an area that does not result in insufficient charge capacity per cell. On the other hand, the optical window should not be so small as to produce an inadequate optical signal. It is preferred to have an optical window comprising about 15 percent to about 30 percent of the area of each of the cells of the array. A still further preferred embodiment utilizes an optical window comprising about 20 percent to about 25 percent of the area of each of said cells.

A feature of the invention is the reduction in row-to-column overlap capacitance. In this regard, the overlap of the rows and columns can be adjusted according to the advantages of the present invention which permit flexible design, so that such capacitance is in the range of about 0.011 pF to about 0.04 pF per cell for designs based on design minimum line widths of 5 $\mu$m, and can be further reduced by reducing the line width.

To fabricate the InSb array, the substrate 15 is coated with an $SiO_2$ layer as a field oxide. The $SiO_2$ field oxide 16 is deposited as for instance by a photon-assisted CVD process. The thickness of such layer is in the range of about 5000 Angstroms to about 6000 Angstroms. After deposition, the first masking step provides for the selective removal of portions of the field oxide to define the active area 23. This is followed by deposition of the first gate oxide 17, again $SiO_2$ in a thickness of about 800 Angstroms to about 1200 Angstroms, with a nominal thickness of 1000 Angstroms being preferred. Silicon nitride may also be used as the gate insulator.

Figure 2B:
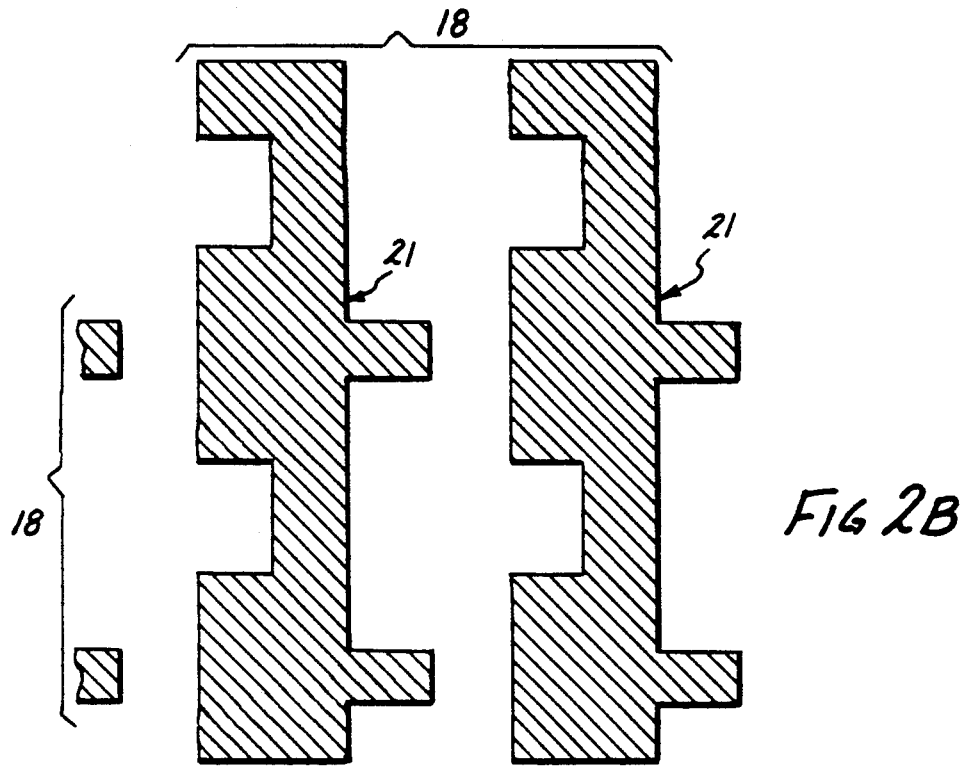

The first metal layer 18 is then deposited. Such metal layer is pure semiconductor grade gold metal on pure chromium or pure titanium metal, with platinum metal or aluminum metal also being acceptable to replace the gold layer. The metal layer 18 can be applied by vacuum deposition or sputtering in the case of gold on chromium. In any event, the first metal layer(s) are laid down in the same chamber, one after the other, without breaking the vacuum. Subsequently, the first metal layer 18 is washed and etched, i.e. patterned to form columns 21 as shown in FIG. 2B.

In one embodiment of the invention the patterning of the first metal layer 18 does not include bonding pads, i.e. column bonding pads located thereon. In a further embodiment of the invention column bonding pads would be included within the pattern formed in the first metal layer 18 in conjunction with formation of the first metal layer 18 as a very thin layer as, for instance, for a total thickness of 400 to 500 Angstroms and the area corresponding to the column bonding pad (in conjunction with the area corresponding to row bonding pads) would be augmented by a further metal deposit as, for instance, a further gold layer to a layer thickness of about 2000 to 2500 Angstroms.

Figure 3:
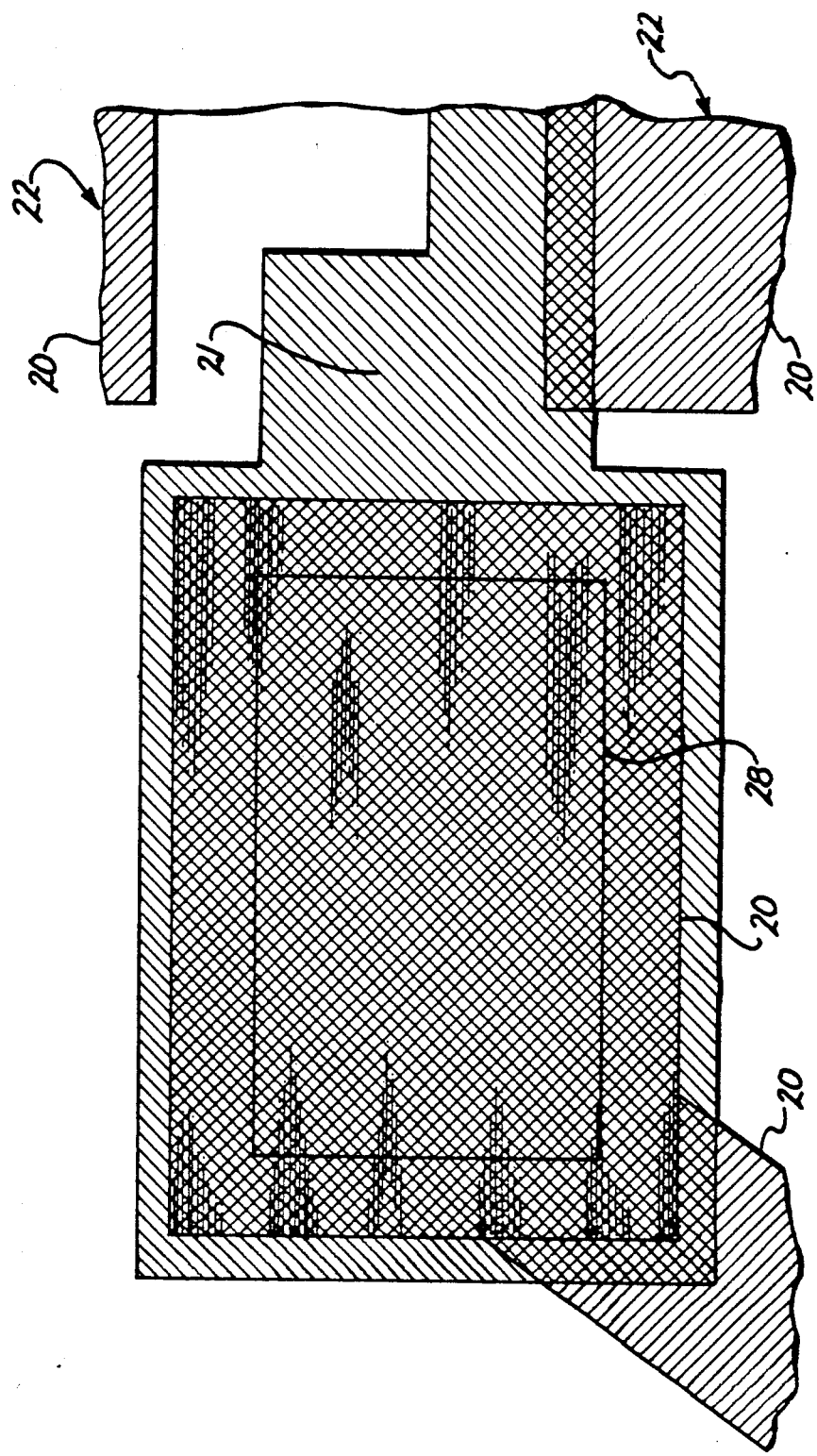
FIG. 3 shows a schematic layout of a contact hole arrangement according to the invention.
Figure 4:
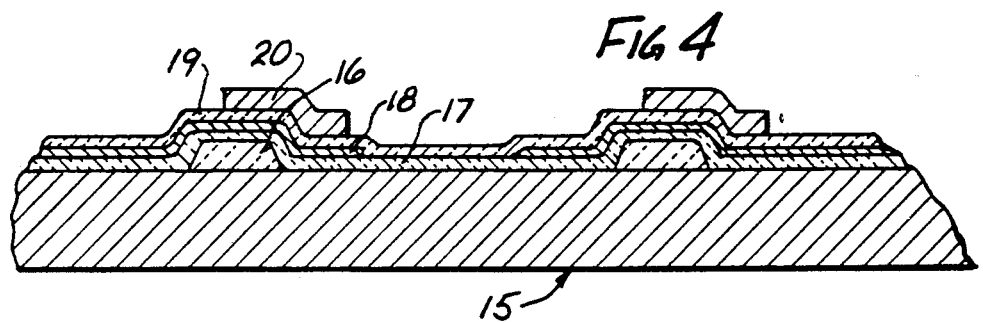
FIGS. 4, 5, 6, and 7 are views in cross-section taken respectively on lines 4—4, 5—5, 6—6 and 7—7 of FIG. 2 and additionally showing the various oxide layers.
Figure 5:
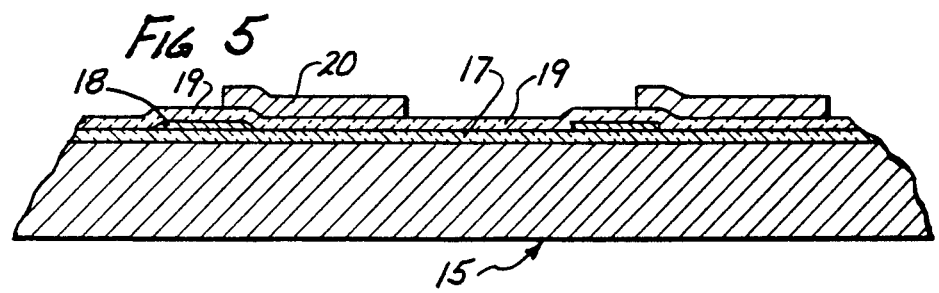
Figure 6:
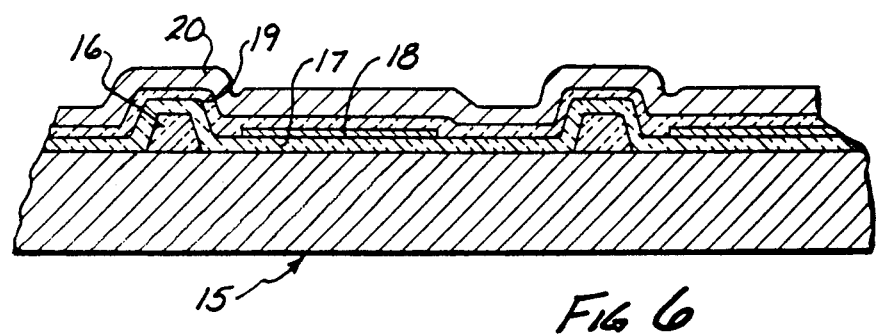
Figure 7:
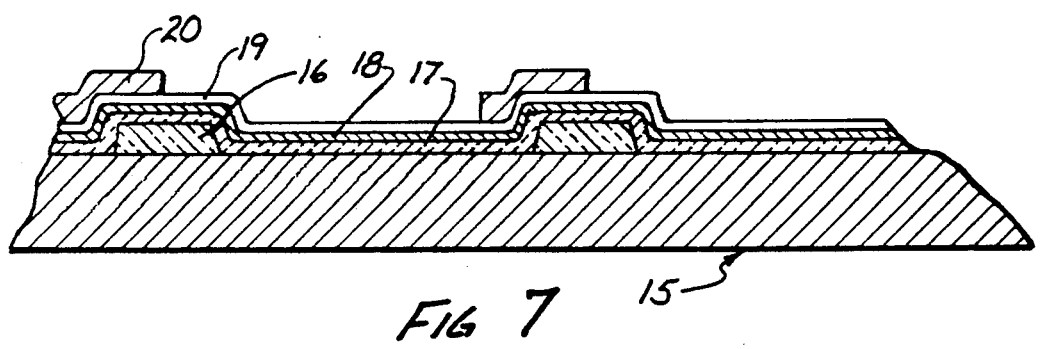

With or without column bonding pads patterned within the first metal layer 18 a second gate oxide layer 19 is then deposited to a thickness of about 800 to about 2000 Angstroms pure silicon dioxide. Silicon nitride may also be used as this gate insulator. In the embodiment which does not include the column bonding pads patterned within the layer of metal 18, the second gate oxide layer is patterned by masking and etching to provide contact holes 28 as shown in FIG. 3.

In each embodiment of the invention a second metal layer 20 is subsequently deposited over the second gate oxide layer 19. The second metal layer 20 can be deposited in a first instance in a thickness of about 6000 Angstroms to about 10,000 Angstroms pure aluminum on pure chromium 100 to 300 Angstroms and in a second instance wherein bonding pads are augmented by a further metal deposition as indicated above, a thinner metal second layer as, for instance, a thin chrome layer of from 70 to 100 Angstroms having a gold layer of 400 to 500 Angstroms located thereon is deposited. Typically, depositing of the second metal is by vacuum deposition.

Figure 2C:
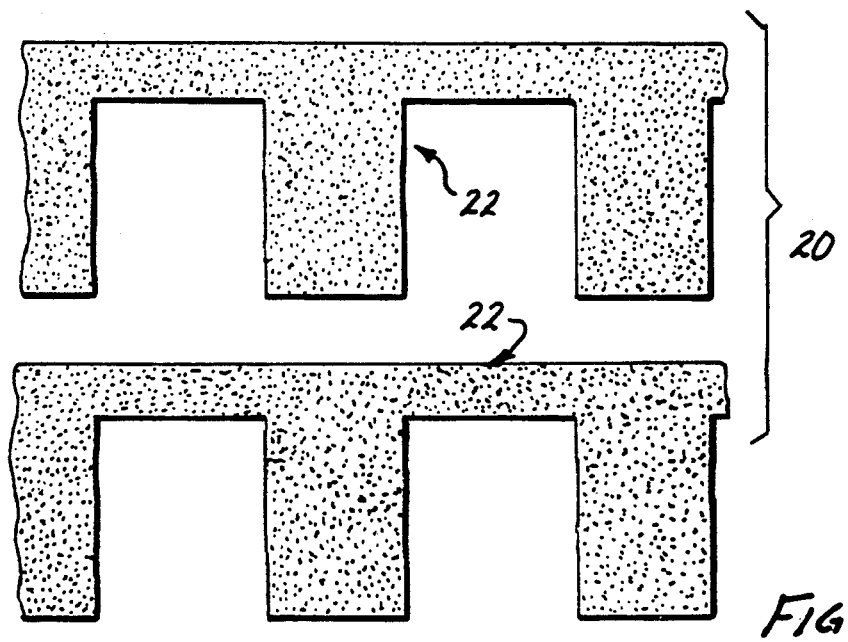
Figure 2D:
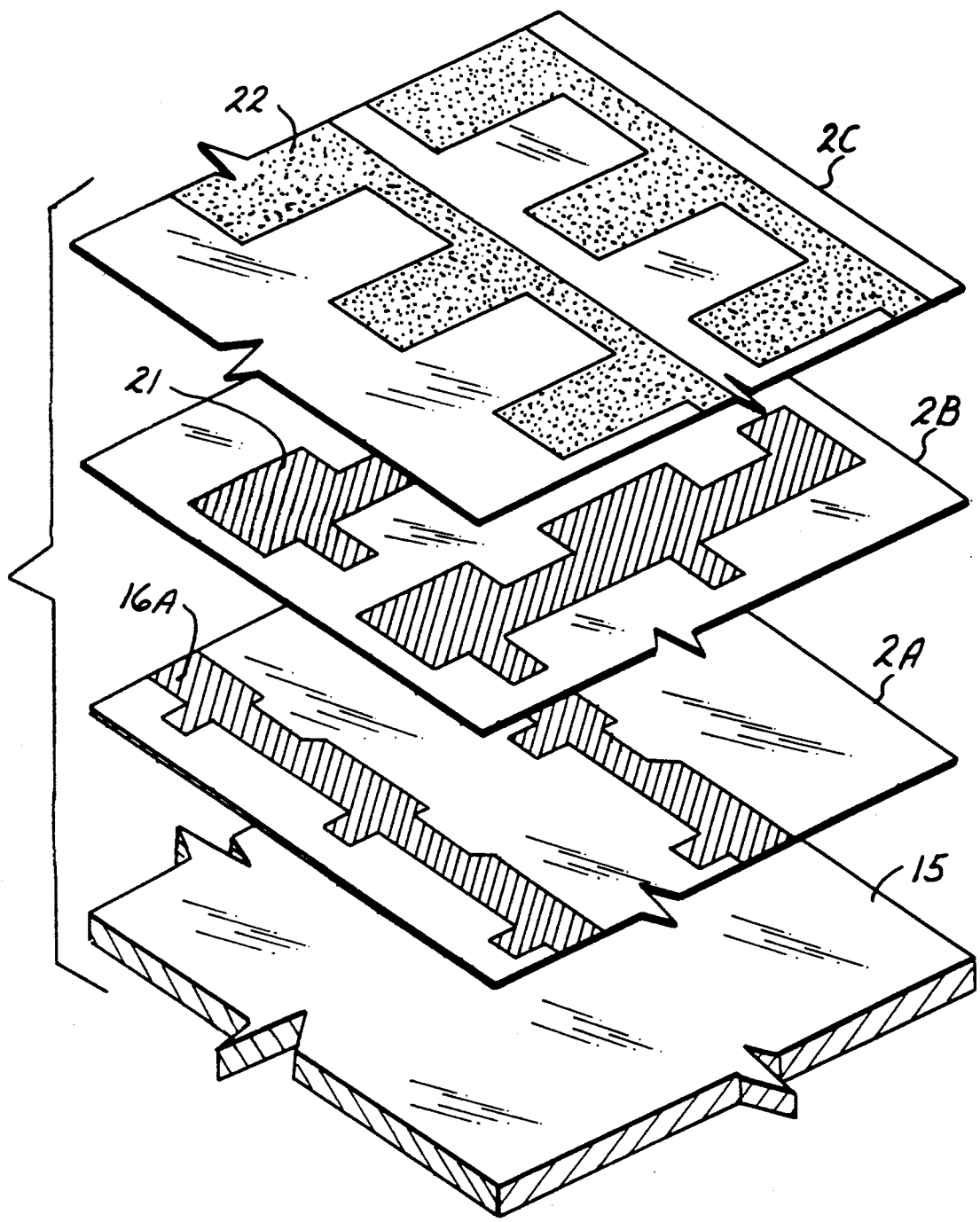
FIG. 2D is a perspective view of the layers of FIGS. 2A-C.

The second metal layer 20 is then patterned by masking and etching to selectively remove portions thereof to provide rows 22 as is shown in FIG. 2C. In the embodiment of the invention wherein column bonding pads are not provided in the first metal layer 18 the second metal layer 20 also provides interconnects from column bonding pads formed in the second metal layer 20 through contact holes 28 illustrated in FIG. 3 and shown in phantom line in FIG. 15.

Figure 15:
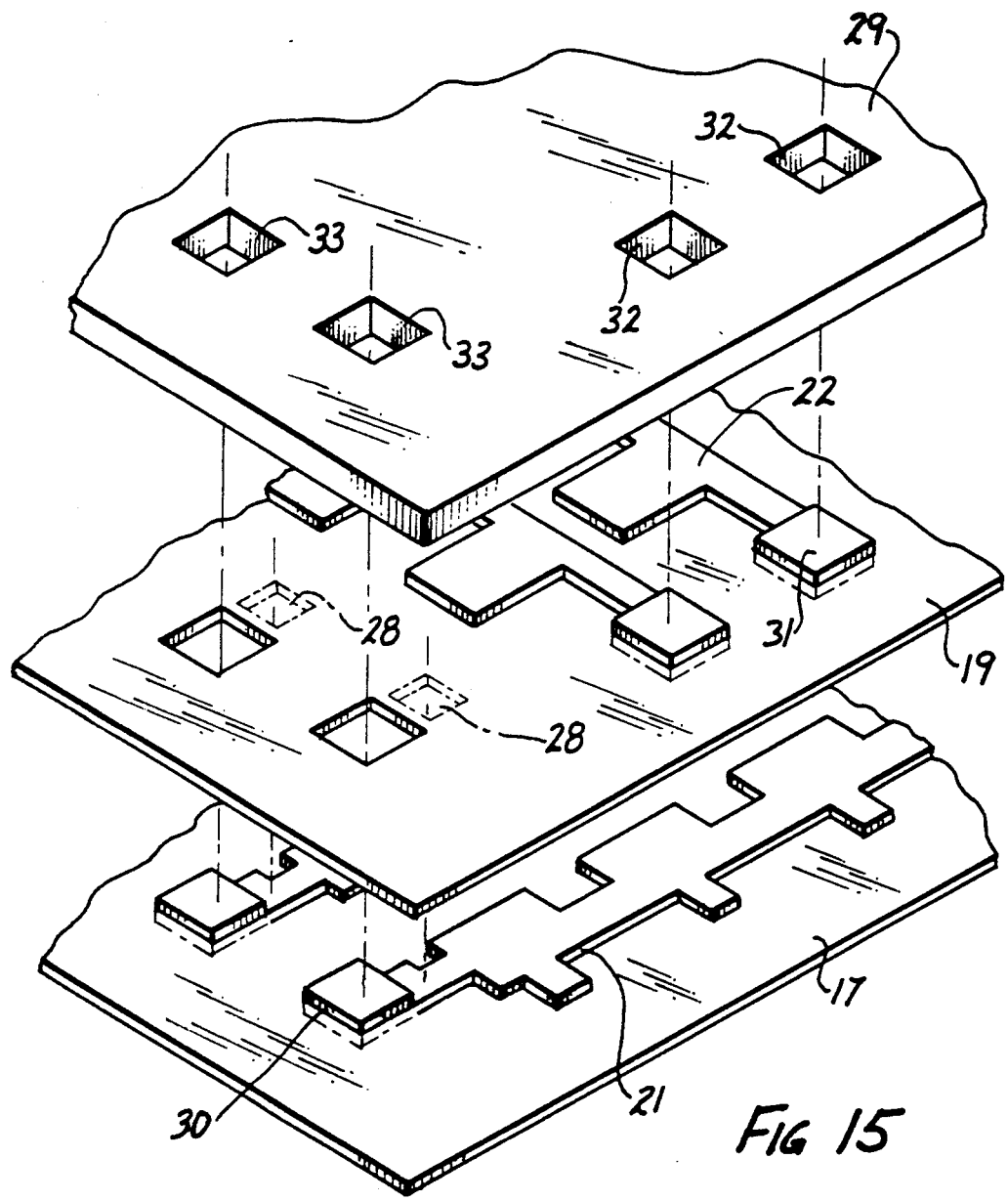
FIG. 15 is an exploded perspective not in scale, showing the use of a passivation layer as an overlaying layer for the rows and columns of the device and wherein a first thickness for bonding pads of the device are shown in solid line and in a further embodiment a second thickness is shown in phantom line.

FIG. 15 shows the location of a passivation layer 29 over the row elements 22. In FIG. 15 a hypothetical device of the invention is constructed to simultaneously illustrate several of the embodiments of the invention. This device is exploded away to show the first gate oxide 17, the columns 21, the second gate oxide 19, the rows 22 and the passivation layer 29.

In the embodiment of the invention wherein windows 28 are etched through the second gate oxide layer 19, the column bonding pads 30, the portion shown in solid line in FIG. 15, would be derived from the second metal layer 20 and contact would be made to the columns 21 via extensions from the solid portion of the bonding pad 30 shown in FIG. 15 through the windows 28 to the columns 21, as illustrated in FIG. 3.

In the embodiment of the invention wherein the column bonding pads 30 are derived from the first metal layer 18, these bonding pads 30 would correspond to the lower portion shown in phantom line in FIG. 15 of the column bonding pads 30 which are integral with the remainder of the columns 21. Thus, in this embodiment both the columns 21, the column bonding pads 30 and the interconnect between the column bonding pads 30 and the columns 21 would be formed and patterned from the first metal layer 18.

In both of the embodiments of the previous two paragraphs, the row bonding pads 31 would be formed as the lower portion of the bonding pads 31 shown in phantom line in FIG. 15. In the embodiment wherein the column bonding pads 30 are formed from the second metal layer 20, the first metal layer 20 can be of a thickness optimizing the device characteristics for the columns 21 because the bonding pads 30 are derived from the second metal layer 20. In both of the above elucidated embodiments the thickness of the row metallization for the rows 22 in the second metal layer 20 would take into account formation of both the rows 22 and the row bonding pads 31 (and the column bonding pads 30 in one of the embodiments) and thus generally in these embodiments the thickness of the second metal layer 20 will be chosen to reflect both the characteristics of the rows 22 and the respective bonding pads. As such generally the second metallization layer 22 will be deposited as a thicker layer as, for instance, from 2000 Angstroms to 10,000 Angstroms.

With use of the passivation layer 29 a further embodiment of the invention allows for utilization of thin metal layers for both the first metal layer 18 and the second metal layer 20 to optimize yield and desired characteristics for the rows 21 and columns 22. The desired thickness of the bonding pads 30 and 31 being built up by a subsequent metal deposition. This is achieved by patterning the passivation layer 29 with a mask to form column bonding pad vias 32 and row bonding pad vias 33 therein. These are etched into the passivation layer 29 and for the column bonding pads also through the second gate oxide 19. A subsequent metal deposit allows for build up of bonding pads 30 and 31 to a thickness different from the thickness of the column and row metal layers 18 and 20. Thus, the first and second metal layers 18 and 20 can be formed as relatively thin layers with the thickness of metallization of the bonding pads 30 and 31 subsequently increase to facilitate wire bonding to the bonding pads 30 and 31 for mounting the devices of the invention as infrared detectors.

The passivation layer 29 will be formed of an oxide as per the field and gate oxides previously described, preferably using $SiO_2$ and alternatively silicon nitride. The passivation layer 29 is typically laid down to a thickness of 2000 to 5000 Angstroms. The passivation layer 29 itself can serve as an anti-reflection coating or it can facilitate the addition of further of anti-reflection coatings on the devices to increase detector quantum efficiency. Generally the totality of the thickness of the passivation layer plus and any other antireflective coatings would be about 1 micron with the thickness of the passivation layer adjusted within the ranges to account for the thickness of any additional anti-reflective coatings applied to the device.

With the use of the vias 32 and 33 in the passivation layer 29, build up of the contact bonding pads 30 and 31 including those portions of these pads shown in both phantom and solid line in FIG. 15 to a thickness of from 2000 to 2500 Angstroms gold is easily facilitated. A photoresist is applied to a wafer having devices of the invention being formed thereon and then is patterned using a final mask which patterns the vias 32 and 33 for the respective bonding pads 31 and 30. The photoresist is then developed with a negative slope as is described in M. Hatzakis et al., "Single-Step Optical Lift-Off Process," IBM, J. RAS. Develop, Vol. 24, p. 452 (1980). Metallization is then deposited through the openings in the photoresist and the photoresist and access metallization on all areas except over the bonding pads 30 and 31 is then removed in a lift-off process. Utilization of a lift-off process for additional metallization of the bonding pads 30 and 31 allows for build up of these bonding pads without an additional fifth masking step.

It is evident that build up of the bonding pads 30 and 31 through the vias 32 and 33 in the passivation layer 29 can be performed to build up the bonding pad 30 either formed within the first metallization layer 18 or formed in the second metallization layer 20 including contact to the first metallization layer 18 through the windows 28.

The above embodiments can thus be summarized as depositing of an oxide field followed by etching of active areas using a first mask. This is followed by depositing of a gate oxide and depositing of a first metal layer.

In a first embodiment a second mask is now used to pattern the column electrodes in the first metal layer followed by depositing of the second gate oxide. A third mask is now used to etch contacts to the columns and this is followed by depositing of the second metal layer. Finally a fourth mask is used to pattern the rows.

In a further embodiment, like the first embodiment, a second mask is used to pattern the column electrodes and this is followed by depositing of a gate oxide. Different however, from the first embodiment the second metal layer (including bonding pads) is now deposited over the gate oxide without etching of the windows into the second gate oxide. A third mask is now used to pattern the row electrodes followed by depositing the passivation oxide. A fourth mask is now used to etch contacts to both the column and the row bonding pads.

In a further embodiment, as per the first two embodiments, a second mask is used to pattern the column electrodes on the first metal layer. Again, as per the other embodiments, a first gate oxide is deposited. As per the immediately preceding embodiment a second metal layer is then deposited and it is patterned with a third mask. In this embodiment both the first and second metal layers can be made relatively thin without having to consider thickness of the row or column bonding pads. As per the immediately preceding embodiment a passivation oxide is now deposited over the patterned row electrodes and it is etched to contact both the row and column bonding pads. This etch is done using the fourth mask. The photoresist from this etch, however, is maintained on the passivation oxide and a further metal is deposited to build up the thickness of the row and column bonding pads. The photoresist and any metal overlaying the negatively sloped photoresist is then removed utilizing a lift-off process.

Each of the above embodiments only requires the use of four masks for their formation.

In a further embodiment of the invention also a 4 mask process, a spacer oxide is formed over the first metal layer. This embodiment is outlined in the sequence of steps shown in FIG. 14 and progressing from FIG. 14A through FIG. 14E.

In FIG. 14A as per the prior embodiments a first metallization layer 18 is deposited over a first gate oxide 17 on the substrate 15. Contrary to the other embodiments of the inventions a thick spacer oxide layer 34 is then deposited over the first metal layer 18. The oxide layer 34 is deposited as a thick oxide layer as, for instance, 2000 to 3000 Angstroms thick. Preferably this again is silicon oxide but, alternatively could be silicon nitride.

The second mask, that for patterning the first metal layer, is now utilized to pattern the spacer oxide 34 as is seen in FIG. 14B. Without removal of this mask it is then further used to pattern a first metal layer 18 to form columns 21 having a spacer oxide 35 located thereon.

The device can now be further fabricated via any of the other embodiments indicated above by overlaying the patterned columns 21 having spacer oxide 35 thereon with the second gate oxide 19. This is then overlaid with the second metal layer 20 seen in FIG. 14E. Patterning of the second metal layer then proceeds as per any of the above indicated embodiments.

Because the spacer oxide layer 34 is utilized to form the thick spacers 35 between the rows and columns 21 and 22, the second gate oxide 19 can be formed as a thin gate oxide layer. By utilizing a thin gate oxide layer 19 the charge capacity of the device formed as per the sequence of steps of FIG. 14 results in an increase of a factor of about 2. This, of course, is an increase above and beyond that gleaned from utilizing the other device implementing steps outlined above. Simultaneously, however, the increased thickness of the layers between the rows and columns constituting both the spacer 35 and the thickness of the second oxide layer 19 decreases the capacitance between the rows and columns by a factor of from 2 to 3. This is accomplished with the addition of only one extra oxide deposition step without increasing the number of masks or masking steps.

In the embodiments above wherein the column bonding pads 30 are patterned in the first metal layer 18, certain advantages are gleaned compared to when contact windows 28 are utilized. Use of the windows 28 requires the use of a photoresist on the second gate oxide 19. Because of diffusion of the photoresist into this gate oxide or contamination of this gate oxide with respect to chemicals utilized in conjunction with the photoresist, improved performance and processing output can be achieved by including the bonding pads 34 of the columns 21 within the first metal layer 18. Of course, as noted above, the thickness of the bonding pads 34 so formed in the layer 18 could be augmented by further addition of metal through the vias 33 formed in the passivation layer 29.

Properties of the spacer oxide are illustrated by concurrent fabrication of arrays on wafers with spacer oxides and without spacer oxides. In these devices field oxide was 5600 Angstroms thick, the first gate oxide was 600 Angstroms thick, the second gate oxide was 800 Angstroms thick and the passivation oxide was 2000 Angstroms thick. In those wafers wherein the devices were fabricated with spacer oxides the spacer oxide was 2100 Angstroms thick. The capacitance voltage measurements were made on the column and row electrodes and comparative capacitance voltage characteristics were obtained for the 128×128 array devices fabricated.

In the devices fabricated with the spacer oxide the accumulation capacitance averaged to be 23.6 pF and in those devices fabricated without the spacer oxide the accumulation capacitance was 32.0 pF. The inversion capacitance in the devices including the spacer oxide was 8.6 pF and the inversion capacitance in the device without the spacer oxide was 15.1 pF.

The spacer oxide provided for a smaller column capacitance in both accumulation and inversion. The inversion capacitance for the structures utilizing the spacer oxide is of a factor of 2 smaller than the corresponding values for those without. Since the column output voltage is inversely proportional to the column output capacitance in inversion, this results in an increase by a factor of 2 in the detected output signal (and sensitivity) for those devices utilizing the spacer oxide compared to those without. This further results in row column capacitance decreases of a factor of from 2 to 3 for the spacer oxide devices compared to the nonspacer oxide devices.

The following summarizes the difference between the old metal window design and the new designs of this invention.

In the old metal window design, the first level mask defined the active region bounded by field oxide on all four sides of each cell; another field oxide served to separate adjacent cells.

In the new designs, the first level mask defines the active region bounded by field oxide on only two sides. The field oxide separates adjacent cells in one direction only; in the other direction, separation is automatic.

In the old metal window design, the first level metal was defined by the second masking step, which was only used to etch the metal layers into columns. Columns consisted of Cr metal.

In the new design, the first level metal and the second masking step is used to etch and define columns, but it is also used to define one periphery of the optical window. The other periphery is defined in a later step when etching the rows. Columns consist of 500-2000 Angstroms gold (nominal) on top of 70-200 Angstroms Cr (nominal).

In the old metal window design, the row electrode consisted of 50 Angstroms Cr and 10,000 Angstroms Al. The row were defined by mask level 4, which resulted from etching aluminum and chrome. The optical window was defined by mask level 5, which etched holes in the aluminum layer on the rows, leaving the 50-70 Angstroms chrome layer as a semitransparent window. Therefore, thickness of the chrome layer was critical.

In the new design depending on the embodiments of the invention, the row electrodes consist of 10,000 Angstroms aluminum on top of 100-300 Angstroms Cr or gold on Cr in the thickness as per the thickness of the columns. (The Cr layer is for adhesion to the underlying oxide.) The row electrodes also define further portions of the periphery of the optical window so that a separate masking step is not required to define the optical windows. In the new design the mask used to etch the rows automatically defines the other periphery (boundary) of the optical window. (The first periphery was defined when columns were etched.) The portions of the row and column electrodes immediately surrounding the periphery of the window form the plates of the row and column cell capacitors.

Further, in the new design (excluding the bonding pads which are not with active window areas of the devices) the row metallization defines the uppermost metallization of the devices.

In the old metal window design and the new designs, the column MIS capacitor consists of the column electrode, the semiconductor substrate, and the intervening insulator (oxide).

In the old metal window design, the row MIS capacitor consisted of the chromium window, the semiconductor substrate, and the intervening insulator (oxide).

In the new design, the row MIS capacitor consists of the row electrode, the semiconductor substrate, and the intervening insulator (oxide) without any need for the chromium window.

The foregoing process produces two dimensional monolithic staring array operational in the front illuminated mode. No semi-transparent metal is used for an optical window. Therefore, the problems of poor transmission and non-uniformity of the semi-transparent optical window used in prior art devices are eliminated. This has resulted in increased yield and performance.

In both old metal window and the new designs, a basic unit cell of the array consists of a column MIS capacitor and a row MIS capacitor. In the new designs, the active area and the column capacitor area have been increased to 57% and 33% of the cell area, respectively, as compared to 50% and 25% in the previous design. More importantly in the new designs, the row-to-column overlap capacitance has been reduced by a factor of at least 3 in all of the embodiments and upwards to a factor of 9 in the embodiment employing a spacer oxide. This improves the FPA performance.

One of the novel features of the invention is the elimination of a semi-transparent metal film from the FPA cell design and fabrication process. Prior infrared detector arrays operating in the front-illuminated mode have used a semitransparent metal film, such as 50–75 Angstroms chromium or titanium, for the optical window. These thin metal films generally have optical transmission in the 40–60% range, have very high resistivity, and the thickness uniformity across a chip and from chip-to-chip may not be satisfactory (which causes pixel-to-pixel nonuniformity). By not using a semitransparent metal film, the above problems have been eliminated. Further with a reduction in the number of mask levels the process complexity has also been reduced.

The FPA fabrication is based on a low-temperature photon-assisted chemical vapor deposition (CVD) process for deposition of silicon dioxide on InSb wafers. After deposition of the field oxide, the first masking step defines the active area. This is followed by deposition of the first gate oxide. Subsequently, the first layer metal is deposited and patterned to form the column electrode. Next, the second gate oxide is deposited. The second level metal is then deposited and patterned. Finally, if desired a passivation layer and antireflection coating are deposited. This defines a two-dimensional, monolithic staring array operating in the front-illuminated mode.

The inventive process outlined above is indeed simple compared to other IR detector or silicon IC fabrication processes. Only three oxide deposition (four if passivation is used) and two metallization steps (three if bonding pad build up is used) are required, with no need for ion implantation, diffusion, and field plates. Therefore, the process makes possible a high-yield, and thus a low-cost, infrared detector array technology. Based on a chip active area of $3.84 \times 3.84$ mm$^2$ and a defect density of 3/cm$^2$ per masking step, the anticipated wafer yield is 23% for a 4-mask process. This yield has been exceeded in actual wafer fabrication. With 16 chips per wafer (as compared to 9, previously), the wafer yield has increased by nearly $10\times$, as compared to prior art designs.

The performance of an imaging device is generally dependent on the dynamic range available from the device. According to the invention, the InSb sensor array is integrated with silicon analog/digital LSI devices on the focal plan substrate. Digital CMOS ICs are used to drive the rows 22 and analog CMOS ICs are used to measure the analog photo-signals on the columns 21. In this approach, the photo-signal generated by a pixel on each column 21 of the array is amplified by a silicon preamplifier. Assuming electronics noise from external circuitry can be neglected, the dynamic range is approximately given by:

$$S_{max} = \frac{qN_{max}}{C_o V_n} \quad (1)$$

where q is the electron charge, $N_{max}$ is the charge capacity per cell of the InSb array, $C_o$ is the output capacitance per column 21 of the array, and $V_n$ is the total RMS noise voltage at the preamplifier input.

The charge capacity is a function of the maximum deep-depletion electric field in the InSb substrate 15, the donor concentration, the oxide thickness, and the interface trap density. The RMS noise voltage $V_n$ has contributions from the detector, $V_{nd}$, and from the preamplifier, $V_{npa}$:

$$V_n = (V^2_{nd} + V^2_{npa})^{\frac{1}{2}} \quad (2)$$

The detector noise has contributions from the incident background photons, interface traps (1/f noise), and thermally-generated dark current. In the inventive devices, the storage time is sufficiently long that dark current noise can be neglected. The 1/f component is also negligible because correlated double sampling with a very short time period between samples is used. The maximum number of background noise carriers is equal to the square root of charge capacity $N_{max}$. The detector RMS noise voltage is then given by:

$$V_{nd} = q N_{max}/C_o \quad (3)$$

Figure 8:
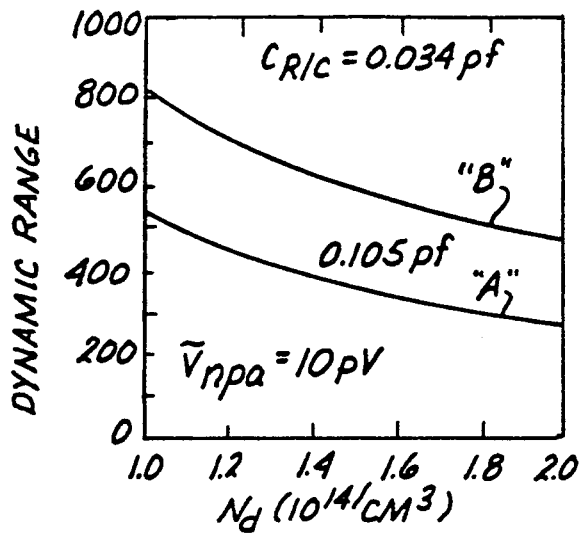
FIG. 8 is a plot of output dynamic range versus donor concentration of the device according to the invention and a prior art device.

From Equation. 1, it is desirable to reduce the capacitance of column 21 in order to increase the dynamic range. For two-dimensional arrays, the row-column overlap capacitance can be a significant part of the capacitance per cell. FIG. 8 shows a plot of the output dynamic range versus the InSb substrate donor concentrations, $N_d$, for a preamplifier input-referred noise voltage of 10 V. The lower curve "A" corresponds to a prior art design, with a row-column overlap capacitance $C_{R/C}$, or 0.105 pF per cell. The top curve "B" 60 is for an embodiment of the inventive design of the invention with a significantly reduced $C_{R/C}$ of 0.034 pF per cell. Utilization of the spacer oxide of the invention further reduces this row column overlap capacitance $C_{R/C}$ by a factor of from 2 to 3 for a further significant reduction of $C_{R/C}$ of about 0.011 pF per cell.

Figure 9:
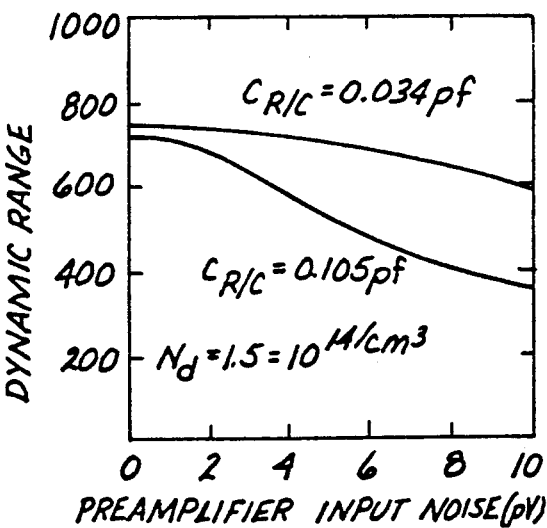
FIG. 9 is a plot of output dynamic range versus preamplifier input noise voltage of a device according to the invention and a prior art device.

FIG. 9 shows the variation of dynamic range with preamplifier input-referred noise voltage, $V_{npa}$, with $C_{R/C}$ as a parameter. At low values of $V_{npa}$, both designs illustrated in FIG. 9 have nearly the same dynamic range, as expected for background-limited operation (BLIP). The inventive design with $C_{R/C}=0.034$ pF has a 18% larger active area (for the same $1.2 \times 1.2$ mil$^2$ unit cell) resulting in slightly higher dynamic range at BLIP as compared to the prior art design with $C_{R/C}=0.105$ pF.

The dynamic range in FIG. 9 for the new design with $C_{R/C}=0.034$ pF is fairly insensitive to variations in preamplifier input-referred noise voltage. This suggests that background-limited operation is indeed achievable with the $128 \times 128$ InSb arrays of the invention, an important feature that has previously been obtained with only linear or small, two-dimensional infrared arrays in the 3-5 μm spectral band.

Figure 10:
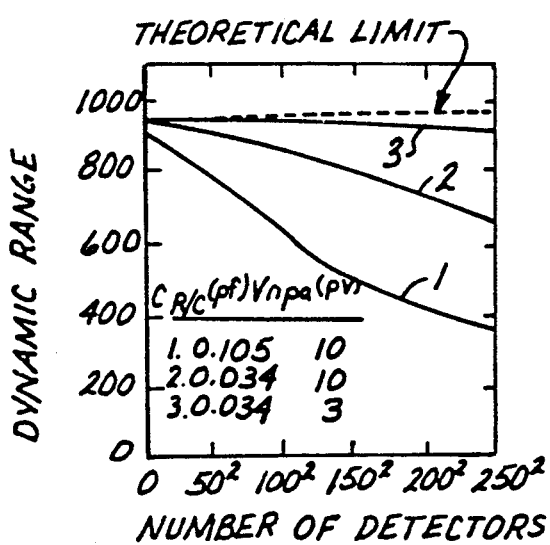
FIG. 10 is a plot of output dynamic range versus array size for a device according to the invention.

In order to show the effect of array size on device performance, the calculated results of FIG. 10 are presented. These calculations are performed for $N_d=1\times10^{14}/cm^3$ and for a maximum deep-depletion electric field of $0.7\times10^4$ V/cm, with $C_{R/C}$ and $V_{npa}$ as parameters. Case No. 1 in FIG. 10 corresponds to the prior art design, but with Nd reduced to $1\times10^{14}/cm^3$ and $V_{npa}=10$ V. For Case 2, $C_{R/C}=0.034$ and $V_{npa}=10$ V.

Finally, Case 3 in FIG. 10 corresponds to reductions in both $C_{R/C}$ and $V_{npa}$ In this case, BLIP can be achieved for even a 256×256 device. Thus, a 256×256 array in the new design would achieve at least a 2× increase in spatial resolution while also improving thermal resolution by at least 4× as compared to the 128×128 prior art array. Further, it would achieve a factor of at least 2× due to reduced capacitance and a factor of at least 2× due to higher transmission in the optical window.

Experimental evaluation of the relative improvement in performance of the invention was made by performing charge transfer experiments performed on 128×128 arrays. In these experiments, charge is integrated under a column site, and at the end of the integration time, an appropriate row is driven to deep depletion to transfer charge from the column to the row site. This charge transfer results in a change in the column voltage, which is measured.

Figure 11:
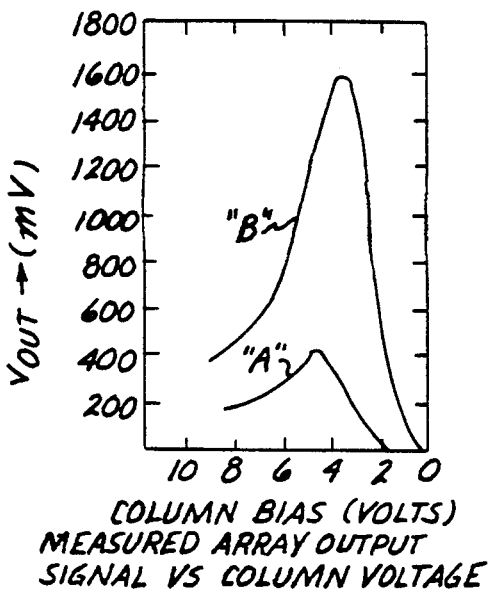
FIG. 11 is a plot of measured array output signal versus column voltage for a device according to the invention and a prior art device.

FIG. 11 shows measured output signal plotted versus column-to-substrate bias voltage for the invention "B" and the prior art "A". The invention shows a much larger output signal than the prior art. However, the relative magnitude of the change is larger than expected, which would indicate that the charge capacity in the new arrays is also significantly higher than calculated. Several design and process-related factors can contribute to the inventions higher output signal: lower than expected row-to-column overlap capacitance, larger active area, higher deep depletion electric field, and lower substrate donor concentration. All of these, except for the reduced overlap capacitance, result in increased charge capacity.

Figure 12:
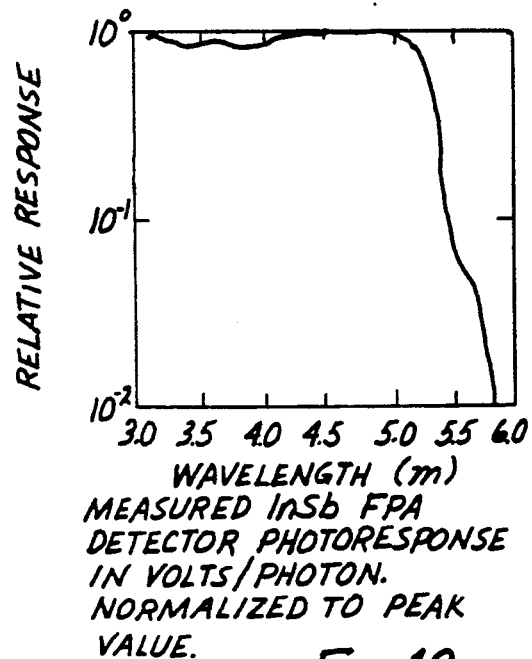
FIG. 12 is a plot of measured InSb FPA detector photo response in volts per photon, normalized to peak value, for a device according to the invention.
Figure 13:
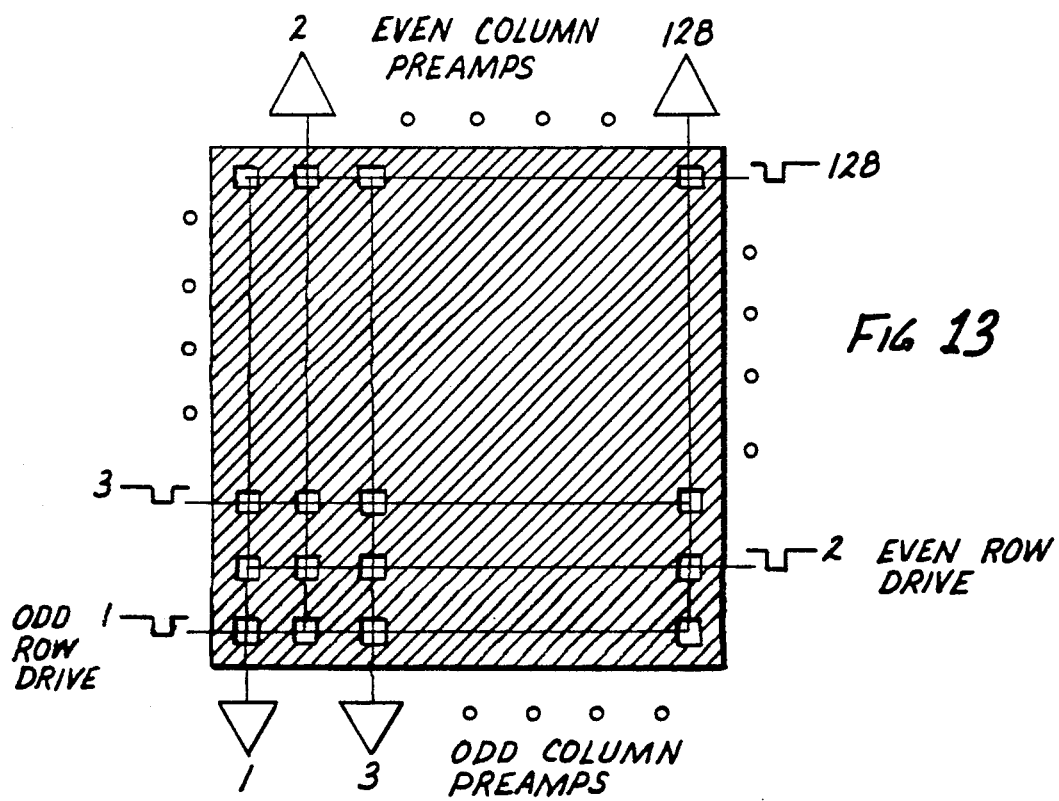
FIG. 13 is a diagram illustrating the row-driver and column-preamp connections.

Spectral response measurements were made on the inventive arrays as well as the prior art. Both types had very similar photo-response characteristics and showed the anticipated 5.5 cut-off wavelength. FIG. 12 shows a typical spectral response of a 128×128 array according to the invention. A very flat response has been obtained in the 3-5 μm spectral region. The data in FIG. 12 are given in volts/photons (and not volts/watts) and normalized to the peak value.

A 128×128 array of the invention has been integrated with silicon row-driver and analog read-out chips on a hybrid substrate for demonstration of thermal imagery. The focal plane substrate was cooled to 77K in a dewar. Out-of-dewar electronics were those describe by David N. Pocock, Ichiro Kasi, David E. Nuttal, Chih-Hong Chen and Robert N. Ting, "*Fabrication and Evaluation of a Monolithic InSb CID*," Proc. Soc. Photo-Optical Instrumentation Engineers, Vol. 217, 129-138 (1980). The system was used to record thermal imagery of aircraft landing. The IR video imagery produced showed satisfactory detail with no corrections for responsivity and gain variations being required.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed is:

1. A staring infrared charge injection detector array device having an optical window for each cell thereof to permit photons to pass into an underlying device semiconductor substrate, said device comprising:
    (a) an infrared semiconductor substrate sensitive to infrared radiation to generate electron hole pairs;
    (b) a field oxide layer deposited on said substrate and patterned to define active areas on said substrate;
    (c) a first gate oxide layer deposited over said patterned field oxide layer;
    (d) a first metal layer deposited over said first gate oxide layer and patterned to define columns and to form a portion of the periphery of the device optical windows;
    (e) a second gate oxide layer deposited over said patterned first metal layer;
    (f) a second metal layer deposited over said second gate oxide as the uppermost metal layer within optical window regions of said device, said second metal layer patterned to define rows and in cooperation with said patterned first metal layer to define an array window formed at each active cell area by boundaries of the rows and columns of said patterned metal layers, said windows being open to face away from the substrate layered surface.

2. A device according to claim 1 wherein: said infrared semiconductor substrate is InSb.

3. A device according to claim 1 wherein:
    said field oxide layer is patterned to form separate strips in the row direction.

4. A device according to claim 3 wherein:
    said strips have an indentation on one edge thereof to provide additional active area.

5. A device according to claim 4 wherein:
    said strips have an outwardly extending charge separation means on the opposite edge thereof.

6. A device according to claim 1 wherein:
    the area of said optical window comprises about 15 percent to about 30 percent of the area of each of said cells.

7. A device according to claim 1 wherein:
    the area of said optical window comprises about 20 percent to about 25 percent of the area of each of said cells.

8. A device according to claim 1 wherein:
    said device includes a row-to-column overlap capacitance of about 0.011 pF to about 0.04 pF per cell.

9. A device according to claim I wherein:
    said pattern in said first metal layer includes column bonding pads and metallization interconnects between said column bonding pads and said columns in said first metal layer.

10. A device according to claim 1 wherein:
    said pattern in said second metal layer includes row bonding pads and metallization interconnects between said row bonding pads and said rows in said second metal layer.

11. A device according to claim 1 wherein:
    said second gate oxide includes contact holes formed in said second gate oxide through a portion of said second gate oxide for forming bonding pads for said columns; and portions of said second metal layer located in said contact holes to form said column bonding pads.

12. A device according to claim 1 including:

a passivation oxide layer deposited over said patterned second metal layer.

13. A device according to claim 12 including:

said device including row and column bonding pads; and openings formed in said passivation oxide layer exposing said row and column bonding pads of said device.

14. A device according to claim 13 including:

said row and column bonding pads being of a thickness greater than the thickness of said first and second metal layers.

15. A device according to claim 14 wherein:

said first and said second metal layers are of a thickness of from about 400 Angstroms to about 500 Angstroms and said row and column bonding pads are of a thickness of about 1500 Angstroms to about 2000 Angstroms.

16. A device according to claim 1 further including:

a spacer oxide located over said patterned first metal layer between said first metal layer and said second gate oxide layer.

17. A device according to claim 16 wherein:

said spacer oxide is of a thickness from about 2 to about 3 times the thickness of said second gate oxide.

18. A device according to claim 1 including:

an anti-reflection coating located over at least said optical windows areas of said device, said anti-reflection coating cooperating with said oxide layers and said substrate to achieve high infrared transmission through each optical window, said anti-reflection coating defining the front surface and first layer through which an infrared photon passes as it enters said device.

* * * * *